(12) United States Patent
Yu et al.

(10) Patent No.: US 11,411,128 B2
(45) Date of Patent: Aug. 9, 2022

(54) MANUFACTURING METHOD OF FLEXIBLE THIN FILM SOLAR CELL MODULE AND THE FLEXIBLE THIN FILM SOLAR CELL MODULE USING THE SAME

(71) Applicant: KOREA INSTITUTE OF SCIENCE AND TECHNOLOGY, Seoul (KR)

(72) Inventors: Hyeonggeun Yu, Seoul (KR); Jeung-hyun Jeong, Seoul (KR); Won Mok Kim, Seoul (KR); Jong-Keuk Park, Seoul (KR); Eunpyung Choi, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/069,862

(22) Filed: Oct. 14, 2020

(65) Prior Publication Data

US 2021/0135029 A1    May 6, 2021

(30) Foreign Application Priority Data

Oct. 31, 2019  (KR) .................. 10-2019-0137908
Aug. 13, 2020  (KR) .................. 10-2020-0101541

(51) Int. Cl.
*H01L 31/0463*   (2014.01)
*H01L 31/0392*   (2006.01)
(Continued)

(52) U.S. Cl.
CPC .. *H01L 31/0463* (2014.12); *H01L 31/022483* (2013.01); *H01L 31/022491* (2013.01); *H01L 31/03928* (2013.01); *H01L 31/1888* (2013.01)

(58) Field of Classification Search
CPC .......... H01L 31/0463; H01L 31/03928; H01L 31/1888; H01L 31/022483;
(Continued)

(56) References Cited

U.S. PATENT DOCUMENTS 9,929,286 B2   3/2018  Iitsuka et al.
10,069,033 B2  9/2018  Forrest et al.
(Continued)

FOREIGN PATENT DOCUMENTS

KR   1020110001795 A   1/2011
KR   1020160108440 A   9/2016
(Continued)

OTHER PUBLICATIONS

Chantana et al., "Trap-assisted recombination for ohmic like contact at p-type Cu(In,Ga)Se2/back n-type TCO interface in superstrate-type solar cell", Journal of Applied Physics, 2016.*
(Continued)

*Primary Examiner* — Tae-Sik Kang
(74) *Attorney, Agent, or Firm* — Cantor Colburn LLP

(57) ABSTRACT

Provided is a method of manufacturing a high efficiency flexible thin film solar cell module including a see-thru pattern. The method of manufacturing a flexible thin film solar cell module includes: sequentially forming a light-absorbing layer, a first buffer layer, and a first transparent electrode layer on the release layer; forming a second buffer layer on the exposed bottom surface of the light-absorbing layer; forming a P2 scribing pattern by removing at least one portion of each of the first buffer layer, the light-absorbing layer, and the second buffer layer; forming a second transparent electrode layer on the second buffer layer and the first transparent electrode layer exposed by the P2 scribing pattern; and forming a P4 see-thru pattern by selectively removing at least one portion of the first buffer layer, the light-absorbing layer, the second buffer layer, and the second transparent electrode layer.

25 Claims, 13 Drawing Sheets

(51) Int. Cl.
*H01L 31/18* (2006.01)
*H01L 31/0224* (2006.01)

(58) Field of Classification Search
CPC ......... H01L 31/022491; H01L 31/0749; H01L 31/1892; H01L 31/0468; Y02E 10/541
See application file for complete search history.

(56) References Cited

U.S. PATENT DOCUMENTS

| | | | |
|---|---|---|---|
| 2010/0294348 A1* | 11/2010 | Li | H01L 31/0468 |
| | | | 136/252 |
| 2011/0240123 A1* | 10/2011 | Lin | H01L 31/03925 |
| | | | 136/260 |
| 2012/0055544 A1* | 3/2012 | Ahn | H01L 31/0465 |
| | | | 136/256 |
| 2015/0249166 A1* | 9/2015 | Iitsuka | G02B 5/0215 |
| | | | 136/256 |
| 2017/0194523 A1* | 7/2017 | Kim | H01L 31/02168 |

FOREIGN PATENT DOCUMENTS

| | | | |
|---|---|---|---|
| KR | 1020190000339 A | 1/2019 | |
| WO | 2014050769 A1 | 4/2014 | |

OTHER PUBLICATIONS

KR Office Action dated Apr. 18, 2022 of KR Application No. 10-2020-0101541.

\* cited by examiner

MANUFACTURING METHOD OF FLEXIBLE THIN FILM SOLAR CELL MODULE AND THE FLEXIBLE THIN FILM SOLAR CELL MODULE USING THE SAME

CROSS-REFERENCE TO RELATED APPLICATION

This application claims the benefit of Korean Patent Application No. 10-2019-0137908, filed on Oct. 31, 2019, and Korean Patent Application No. 10-2020-0101541, filed on Aug. 13, 2020, in the Korean Intellectual Property Office, the disclosure of which is incorporated herein in its entirety by reference.

BACKGROUND

1. Field

The present invention relates to a method of manufacturing a thin film solar cell module, and more particularly, to a method of manufacturing a flexible thin film solar cell module capable of implementing a flexible thin film solar cell module having light transmittance and high efficiency.

2. Description of the Related Art

Chalcogenide thin film solar cells are lightweight and have photovoltaic efficiency similar to that of crystalline silicon solar cells. Extensive research has been conducted on such thin film solar cells as next-generation energy technology since the thin film solar cells are applicable to various environments. Particularly, since the technology for manufacturing thin film solar cells that are transparent and physically flexible is also applicable to the manufacture of building-integrated solar cells and vehicle-integrated solar cells for distributed energy generation in cities, steady research thereon has been conducted.

However, since light transmittance is obtained by forming a ultra-thin light-absorbing layer, in most of the light-transmitting solar cell technologies, problems of deteriorated photovoltage and fill factor arise as the thickness of the light-absorbing layer decreases. Since research on solar cells including a thin film of an amorphous silicon or organic material, which is easily formed as a ultra-thin film, as a light-absorbing layer, has been mainly conducted in terms of processability, photovoltaic efficiency of light-transmitting solar cells reported to date is less than 8% at an average visible light transmittance of 30%.

Technology for implementing high efficiency chalcogenide thin film solar cells having both light transmittance and flexibility has not been reported so far. This is because flexible substrate materials capable of withstanding high temperature above 500° C., which is required for crystallization of a chalcogenide thin film, have not been developed yet. Although a high efficiency Cu(In,Ga)Se$_2$ thin film solar cell formed on a polyimide film, which has the highest glass transition temperature among flexible substrate materials, has been reported, it is impossible to implement a light-transmitting solar cell due to a very low light transmittance of polyimide.

Meanwhile, polyester films having excellent light transmittance in a wavelength of visible light (400 nm to 700 nm), e.g., polyethylene terephthalate (PET) or polyethylene naphthalate (PEN), have a very low glass transition temperature lower than 120° C., and thus it is impossible to directly form a chalcogenide thin film thereon. Therefore, there is a need to develop technology for implementing a high efficiency chalcogenide thin film solar cell on a transparent flexible substrate having a lower glass transition temperature.

SUMMARY

The present invention has been proposed to solve various problems including the above problems, and an object of the present invention is to provide a method of manufacturing a flexible thin film solar cell module capable of implementing a flexible tin film solar cell module having both high efficiency photovoltaic performance and light transmittance. However, problems to be solved are illustrative and the scope of the present invention is not limited thereby.

Additional aspects will be set forth in part in the description which follows and, in part, will be apparent from the description, or may be learned by practice of the presented embodiments.

According to an aspect of the present invention to achieve the object, provided is a method of manufacturing a flexible thin film solar cell module.

The method of manufacturing a flexible thin film solar cell module includes: forming a release layer on a release substrate; sequentially forming a light-absorbing layer, a first buffer layer, and a first transparent electrode layer on the release layer; forming a P3 scribing pattern by removing at least one portion of the first transparent electrode layer and the first buffer layer; forming a transparent glue layer on the top surface of the first transparent electrode layer and a region formed by the P3 scribing pattern; forming a flexible substrate on the transparent glue layer; joining the first transparent electrode layer to the flexible substrate by curing the transparent glue layer; removing the release substrate and the release layer from the light-absorbing layer; forming a second buffer layer on the exposed bottom surface of the light-absorbing layer; forming a P2 scribing pattern by removing at least one portion of each of the first buffer layer, the light-absorbing layer, and the second buffer layer; forming a second transparent electrode layer on the second buffer layer and the first transparent electrode layer exposed by the P2 scribing pattern; forming a P1 scribing pattern by removing at least one portion of the second transparent electrode layer and the second buffer layer; and forming a P4 see-thru pattern by selectively removing at least one portion of the first buffer layer, the light-absorbing layer, the second buffer layer, and the second transparent electrode layer.

The forming of the P4 see-thru pattern may include forming a P4 see-thru pattern by emitting a laser beam in a direction from the second transparent electrode layer to the flexible substrate, wherein a laser including a light source emitting light having a wavelength band absorbable by the light-absorbing layer.

The forming of the P4 see-thru pattern may include forming a P4 see-thru pattern by emitting a laser beam in a direction from the flexible substrate to the second transparent electrode layer, wherein a laser including a light source emitting light having a wavelength band transmitting the flexible substrate, the transparent glue layer, and the first transparent electrode layer and absorbable by the first buffer layer.

An intensity of the laser beam may be relatively higher than a critical energy of a laser beam used to form the P3 scribing pattern.

The forming of the P4 see-thru pattern may include forming the P4 see-thru pattern by emitting laser beams of laser sources aligned in the form of dots spaced apart from each other or partially overlapping each other.

The P4 see-thru pattern may include a pattern in the form of holes or lines.

A diameter of the hole or a width of the line may be 200 μm or less (greater than 0).

The P4 see-thru pattern may be formed in a continuous or partially discontinuous band shape with a certain width from one end to the other end of the module.

The first buffer layer may include at least one of CdS, Zn(O,S), Sn-doped $ZnO_x$, Ti-doped $ZnO_x$, i-$ZnO_x$, and Mg-doped $ZnO_x$, (Mg,Al)-doped $ZnO_x$.

The first transparent electrode layer may include one of In-doped $SnO_x$, Al-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure.

The forming of the transparent glue layer may include forming a transparent glue layer in contact with the top surface of the light-absorbing layer exposed by the P3 scribing pattern.

The second buffer layer may include one of $MoO_x$, $WO_x$, $NiO_x$, $VO_x$, $CuO_x$, and Cu-doped $NiO_x$.

The second transparent electrode layer may include one of In-doped $SnO_x$, A-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure According to another aspect of the present invention to achieve the object, provided is a flexible thin film solar cell module.

The flexible thin film solar cell module includes: a transparent glue layer formed on a flexible substrate; a first transparent electrode layer formed on the transparent glue layer; a first buffer layer formed on the first transparent electrode layer; a light-absorbing layer formed on the first buffer layer; a second buffer layer formed on the light-absorbing layer; a second transparent electrode layer formed on the second buffer layer; and a penetrated P4 see-thru pattern formed by selectively removing at least one portion of the first buffer layer, the light-absorbing layer, the second buffer layer, and the second transparent electrode layer.

The P4 see-thru pattern may include a pattern in the form of holes or lines.

A diameter of the hole or a width of the line may be 200 μm or less (greater than 0).

The P4 see-thru pattern may be formed in a continuous or partially discontinuous band shape with a certain width from one end to the other end of the module.

The first buffer layer may include at least one of CdS, Zn(O,S), Sn-doped $ZnO_x$, Ti-doped $ZnO_x$, i-$ZnO_x$, and Mg-doped $ZnO_x$, (Mg,Al)-doped $ZnO_x$.

The first transparent electrode layer may include one of In-doped $SnO_x$, Al-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure.

The transparent glue layer may include a thermosetting resin or a photocurable resin.

The second buffer layer may include one of $MoO_x$, $WO_x$, $NiO_x$, $VO_x$, $CuO_x$, and Cu-doped $NiO_x$.

The second transparent electrode layer may include one of In-doped $SnO_x$, A-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure.

The flexible thin film solar cell module may include a P3 scribing pattern formed by selectively removing at least one portion of the first transparent electrode layer and the first buffer layer.

The transparent glue layer may be in a form buried in a region where the P3 scribing pattern is formed and has a structure in contact with the light-absorbing layer.

The flexible thin film solar cell module may include a P2 scribing pattern formed by selectively removing at least one portion of the first buffer layer, the light-absorbing layer, and the second buffer layer.

The flexible thin film solar cell module may include a P1 scribing pattern formed by selectively removing at least one portion of the second buffer layer and the second transparent electrode layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

Hereinafter, in order to develop technology for implementing flexible thin film solar cells with high efficiency, light transmittance, and flexibility, a case in which a $CuIn_xGa_{1-x}Se_2$ (CIGS) chalcogenide thin film having photovoltaic efficiency similar to that of silicon solar cells is used as a light-absorbing layer will be described in the present invention.

FIGS. 1 to 10 are diagrams schematically illustrating sequential processes of a method of manufacturing a flexible thin film solar cell module according to an embodiment of the present invention.

Figure 1:
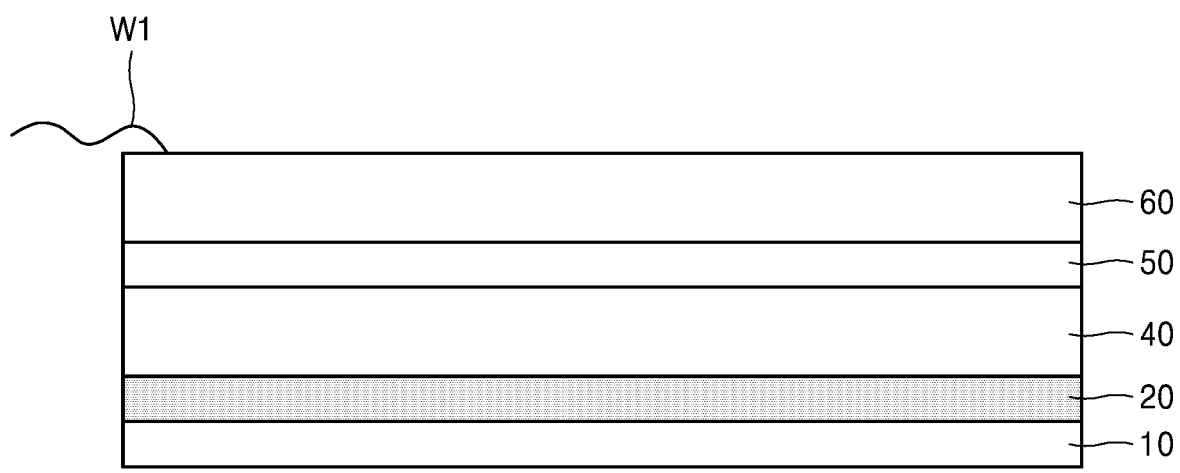
FIGS. 1 to 10 are diagrams schematically illustrating sequential processes of a method of manufacturing a flexible thin film solar cell module according to an embodiment of the present invention.

Referring to FIG. 1, a release layer 20 may be formed on a release substrate 10. The release substrate 10 may be formed of various materials such as glass and a polymer material. The release layer 20 may be formed of, for example, molybdenum (Mo) having high conductivity and excellent corrosion resistance by a selenization process, and the like. The release layer 20 may be deposited on the release substrate 10 by sputtering, or the like. In this regard, deposition methods by sputtering are well known in the art, and thus detailed descriptions thereof will be omitted.

Although the release layer 20 is used as a single layer, a structure in which two or more layers are laminated using a transparent conductive material may also be used in some cases. For example, the transparent conductive material, if required, may include an oxide such as indium tin oxide (ITO), F-doped tin oxide (FTO), and Al/Ga-doped zinc oxide (AZO or GZO).

Subsequently, a light-absorbing layer 40, a first buffer layer 50, and a first transparent electrode layer 60 may sequentially be formed on the release layer 20. The light-absorbing layer 40 may be formed of, for example, Cu(In, Ga)(Se,S)$_2$. Various methods may be used to form the light-absorbing layer 40. The methods are well known in the art, and thus detailed descriptions thereof will be omitted.

The first buffer layer 50 may include, for example, one of CdS, Zn(O,S), Sn-doped ZnO$_x$, Ti-doped ZnO$_x$, i-ZnO$_x$, Mg-doped ZnO$_x$, and (Mg,Al)-doped ZnO$_x$. The first transparent electrode layer 60 may include, for example, one of In-doped SnO$_x$, Al-doped ZnO$_x$, In-doped ZnO$_x$, Ga-doped ZnO$_x$, B-doped ZnO$_x$, Ag nanowire, graphene, carbon nanotube, Ag, Mg:Ag alloy, Au, and an electrode material having a metal oxide/thin metal/metal oxide (OMO) structure.

Types and components of the first buffer layer 50 and the first transparent electrode layer 60 are selected according to the type of the light-absorbing layer 40. Also, although not shown in the drawings, a separate buffer layer (not shown) may further be interposed between the first buffer layer 50 and the first transparent electrode layer 60 to adjust a bandgap therebetween.

An external contact may be secured by connecting a first wire W1 formed of a metallic material to a portion of the first transparent electrode layer 60. Although not shown in the drawings, a grid (not shown) may be formed at a portion of the first transparent electrode layer 60, and the first wire W1 may be formed at the grid. The first wire W1 may be formed consecutively after forming the first transparent electrode layer 60. However, for the convenience of a P3 scribing patterning process which will be performed later, the wire formation process may be performed after performing a process of patterning the first transparent electrode layer 60.

Figure 2:
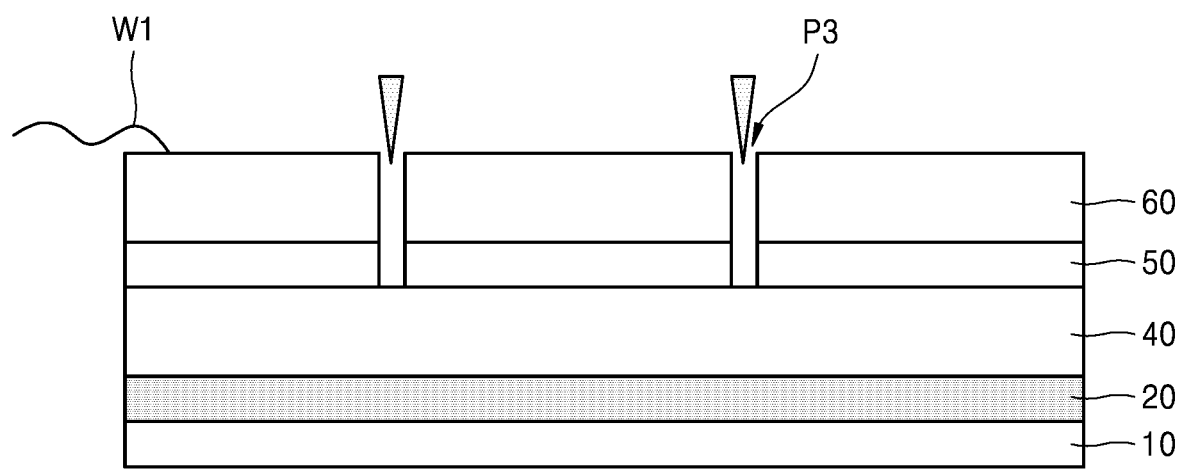

Referring to FIG. 2, a P3 scribing pattern may be formed by removing at least one portion of each of the first transparent electrode layer 60 and the first buffer layer 50 by using a laser scribing method. In this case, the P3 scribing pattern insulates the first transparent electrode layer 60 and the first buffer layer 50, and the first transparent electrode layer 60 and the first buffer layer 50 are divided in the form of strips by the pattern. In general, formation of a P3 scribing pattern is performed in the last stage in a single integrated module of a CIGS thin film solar cell. However, in the present invention, formation of the P3 scribing pattern is performed in the first stage. The reason why the P3 scribing pattern is formed first is that it is difficult to process P3 after the structure is transferred to a flexible substrate.

A laser beam for forming the P3 scribing pattern is irradiated in a direction from the first transparent electrode layer 60 to the light-absorbing layer 40. The P3 scribing pattern is processed by emitting, to the top surface of the first transparent electrode layer 60, a laser beam having an energy capable of delaminating the first transparent electrode layer 60 and the first buffer layer 50 via thermal shock caused by the laser beam absorbed by the light-absorbing layer 40 after passing through the first transparent electrode layer 60 and the first buffer layer 50.

Figure 3:
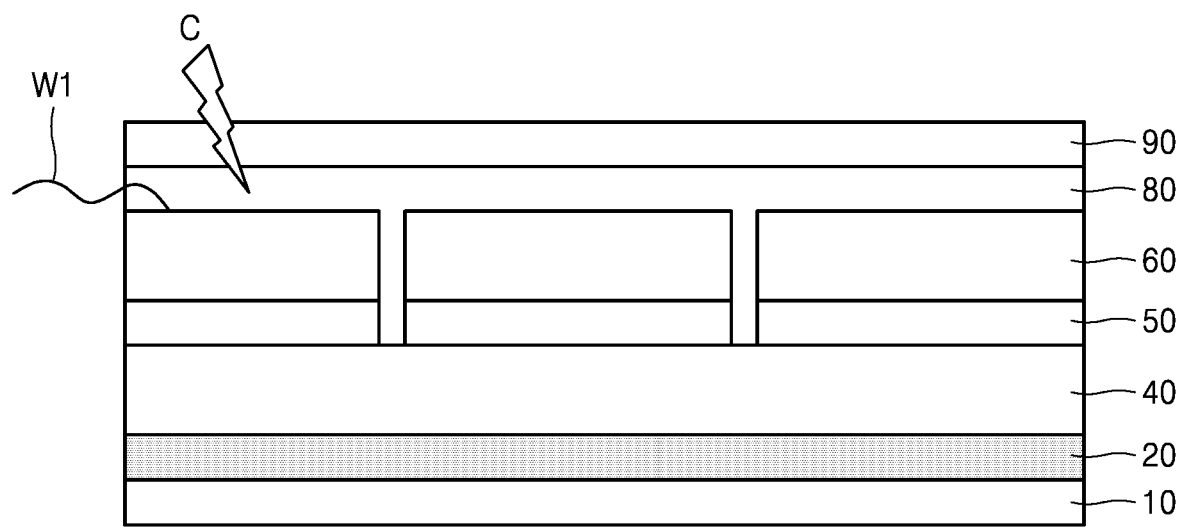
Figure 4:
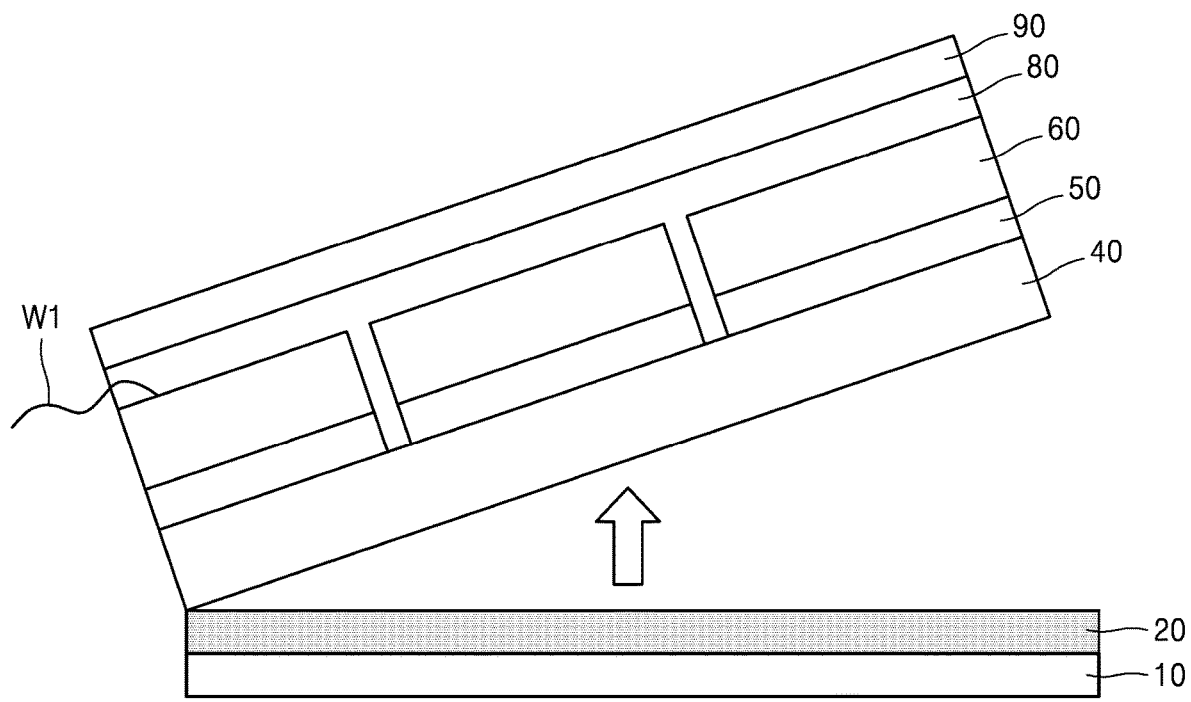

Referring to FIGS. 3 and 4, a transparent glue layer 80 may be formed on the top surface of the first transparent electrode layer 60 and regions formed by the P3 scribing pattern P3. The transparent glue layer 80 may include, for example, a thermosetting resin or a photocurable resin. The transparent glue layer 80 is filled to be in contact with top surface of the light-absorbing layer 40 and side surfaces of the first transparent electrode layer 60 and the first buffer layer 50 which are exposed in the region of the P3 scribing pattern P3. In addition, the transparent glue layer 80 is formed over the entire top surface of the first transparent electrode layer 60 to cover the entire surface of a thin film structure. In this regard, the thin film structure refers to a structure in which the release substrate 10, the release layer 20, the light-absorbing layer 40, the first buffer layer 50, and the first transparent electrode layer 60 are sequentially deposited.

The transparent glue layer 80 is applied thereto such that the top surface of the transparent glue layer 80 is maintained at a constant level at every position. When a grid and/or wire are present on the first transparent electrode layer 60, the transparent glue layer 80 is coated at a relatively higher level than a height of the grid and/or wire.

After forming the transparent glue layer 80 on the first transparent electrode layer 60, a flexible substrate 90 may be formed on the transparent glue layer 80. The flexible substrate 90 may be formed using, for example, a polyimide film or a polyester film such as PET and PEN. After forming the flexible substrate 90 on the transparent glue layer 80, the first transparent electrode layer 60 may be joined to the flexible substrate 90 by curing the transparent glue layer 80 by applying heat or emitting light to the transparent glue layer 80 as indicated by C.

As an example, when a polymer-based photocurable resin is used to form the transparent glue layer 80, the transparent glue layer 80 may be cured by emitting light using a lamp that emits light having a wavelength of UV light absorbed by the transparent glue layer 80. For example, the first transparent electrode layer 60 may be joined to the flexible substrate 90 by inducing polymerization of the transparent glue layer 80 by emitting UV light having a wavelength of 400 nm or less thereto.

As another example, when an acrylic thermosetting resin is used to form the transparent glue layer 80, the first transparent electrode layer 60 may be joined to the flexible substrate 90 by inducing polymerization of the transparent glue layer 80 by heating the transparent glue layer 80 to a temperature higher than a curing temperature.

After curing the transparent glue layer 80, the release layer 20 and the release substrate 10 located at lower portions of the thin film structure are delaminated therefrom. In this case, due to physical properties of the flexible substrate 90, delamination may be possible sequentially from one end of the joined surface to the other end. In this case, molybdenum (Mo) used as a material of the release layer 20 is generally used as a rear electrode of the light-absorbing layer 40. Since molybdenum (Mo) has a weak adhesive force to the light-absorbing layer 40, the release substrate 10 and the flexible substrate 90 may be easily separated by applying a tensile force thereto after curing the transparent glue layer 80. In this case, due to a low adhesive force between the light-absorbing layer 40 and the release layer 20, the light-absorbing layer 40 and all of the thin films formed thereon are transferred to the transparent flexible substrate 90, and the rear surface of the light-absorbing layer 40 is exposed to the outside.

Figure 5:
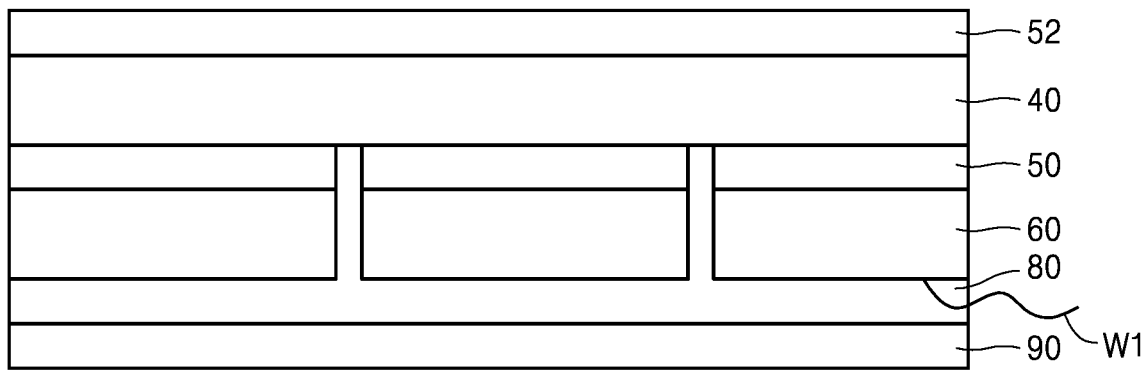

Referring to FIG. 5, a second buffer layer 52 is formed on the bottom surface of the light-absorbing layer 40 exposed to the outside. The second buffer layer 52 performs not only a function to improve ohmic contact between the light-absorbing layer 40 and a transparent electrode layer, which will be described later, but also a function to prevent performance deterioration of the chalcogenide light-absorbing layer 40 by damages caused by deposition of the transparent electrode layer.

The second buffer layer 52 should be formed of a material capable of minimizing electrical resistance between the light-absorbing layer 40 and the transparent electrode layer to be deposited later and preventing deterioration of the light-absorbing layer 40 caused by deposition of an oxide thin film by deposition, in general, sputtering, of the transparent electrode layer. For example, the second buffer layer 52 may include one of $MoO_x$, $WO_x$, $NiO_x$, $VO_x$, $CuO_x$, and Cu-doped $NiO_x$ which may serve as a hole injection layer and a protection layer.

Figure 6:
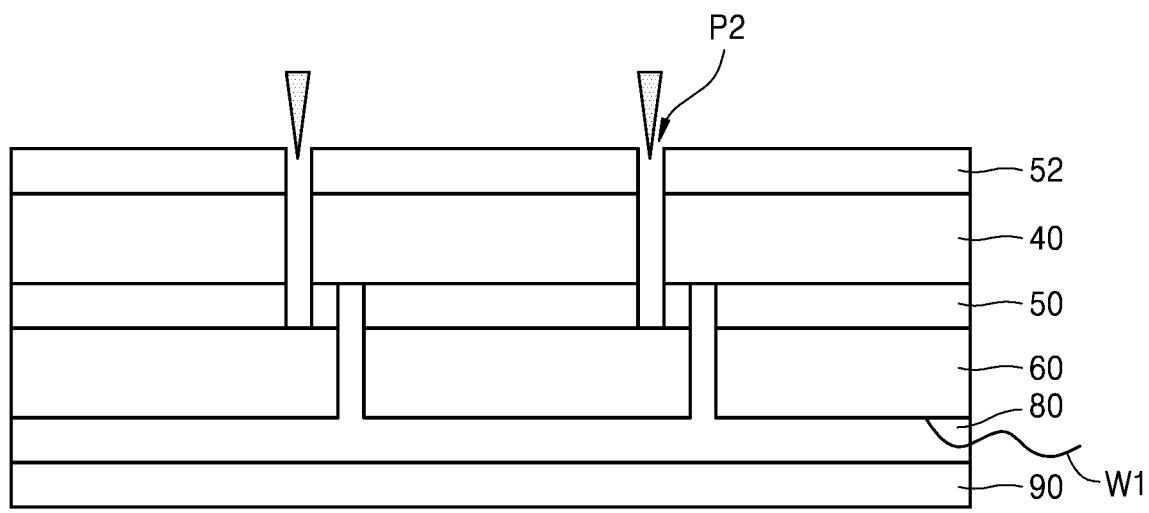

Referring to FIG. 6, a P2 scribing pattern P2 may be formed by selectively removing at least one portion of each of the first buffer layer 50, the light-absorbing layer 40, and the second buffer layer 52 by performing a laser scribing process. In this case, the P2 scribing pattern P2 is formed to be spaced apart from the P3 scribing pattern P3 by a certain distance not to overlap each other, and the first buffer layer 50, the light-absorbing layer 40, and the second buffer layer 52 are divided in the form of strips by the P2 scribing pattern P2.

As an example, the P2 scribing pattern P2 is formed by emitting a laser beam in a direction from the second buffer layer 52 to the flexible substrate 90. In this case, a laser capable of emitting light having a wavelength that transmits the second buffer layer 52, without being absorbed thereby, and is absorbed by the light-absorbing layer 40 may be used. Portions of the first buffer layer 50, the light-absorbing layer 40, and the second buffer layer 52 are removed by the processed P2 scribing pattern P2, so that a portion of the first transparent electrode layer 60 may be exposed to the outside. In this case, as the first buffer layer 50, a wide bandgap oxide thin film may be used. As another example, when a CdS thin film is used as the first buffer layer 50, the CdS thin film may not be completely removed by emitting the laser beam in a direction from the second buffer layer 52 to the flexible substrate 90. Thus, by emitting the laser beam in a direction from the flexible substrate 90 to the second buffer layer 52, the P2 scribing pattern may be formed. In this case, a laser capable of emitting light having a wavelength that transmits the flexible substrate 90, the transparent glue layer 80, and the first transparent electrode layer 60, without being absorbed thereby, and is absorbed by the first buffer layer 50 may be used.

Figure 7:
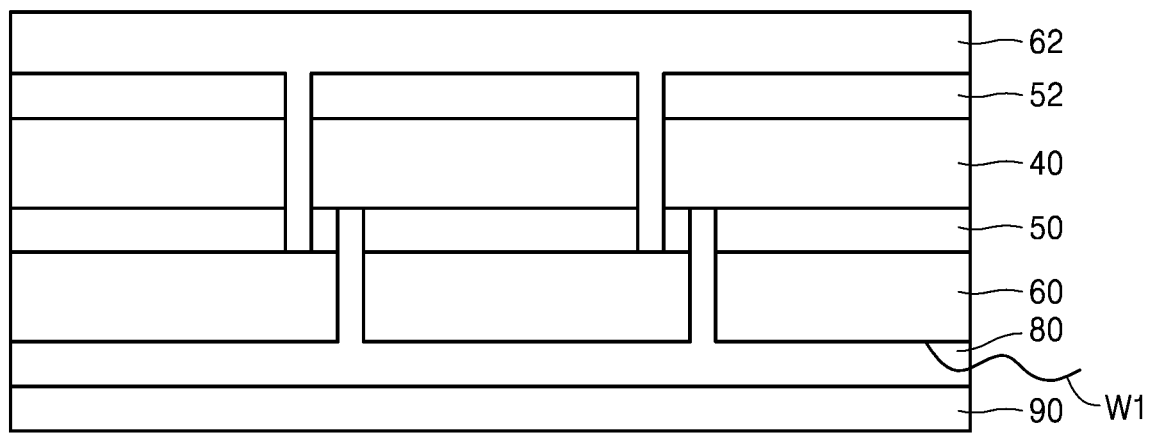
Figure 8:
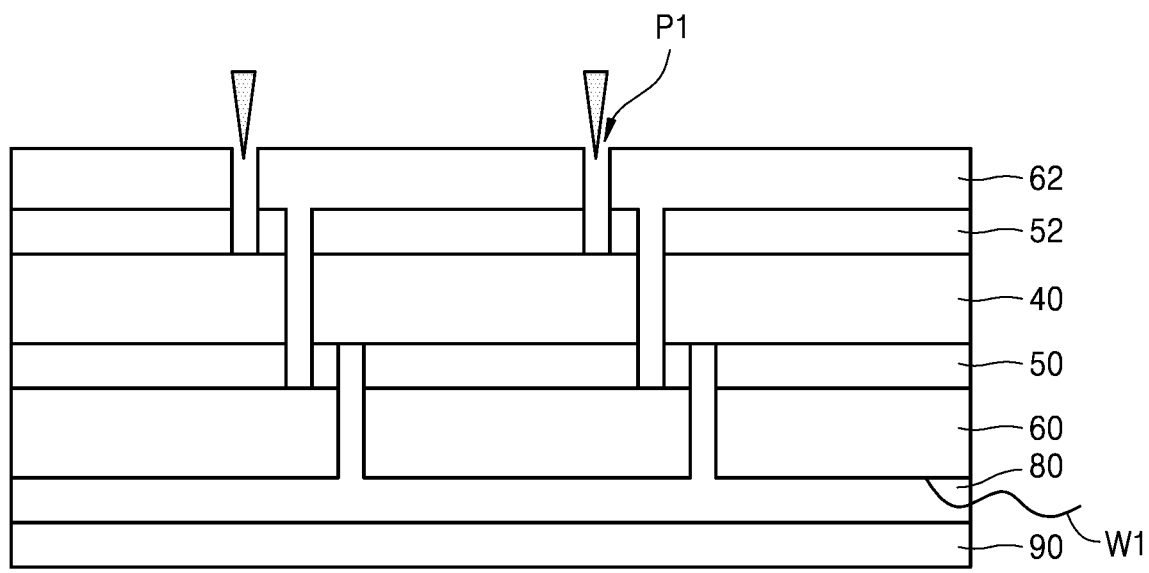

Referring to FIGS. 7 and 8, a second transparent electrode layer 62 may be formed on the second buffer layer 52. The second transparent electrode layer 62 may include, for example, one of In-doped $SnO_x$, Al-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure.

After forming the second transparent electrode layer 62, a process of forming a P1 laser scribing pattern P1 is performed. In this case, the P1 scribing pattern P1, the P2 scribing pattern P2, and the P3 scribing pattern P3 are spaced apart from one another not to overlap one another, and the second buffer layer 52 and the second transparent electrode layer 62 may be divided in the form of strips by the P1 scribing pattern P1. In this regard, a power of a laser beam used to process the P1 scribing pattern P1 has a relatively lower energy than a power of the laser beam used to process the P2 scribing pattern P2. Specifically, the P2 scribing pattern P2 is formed using a principle in which a laser beam absorbed by the light-absorbing layer 40 melts down the light-absorbing layer 40. On the contrary, in the case of the P1 scribing pattern P1, although the light-absorbing layer 40 absorbs the laser beam in the same manner as the P2 scribing pattern P2, a weaker power of the laser beam unable to melt the light-absorbing layer 40 is used in the P1 scribing pattern P1. In this case, the P1 scribing pattern P1 is formed by removing only the second buffer layer 52 and the second transparent electrode layer 62 formed on the light-absorbing layer 40 by heat shock.

Figure 9:
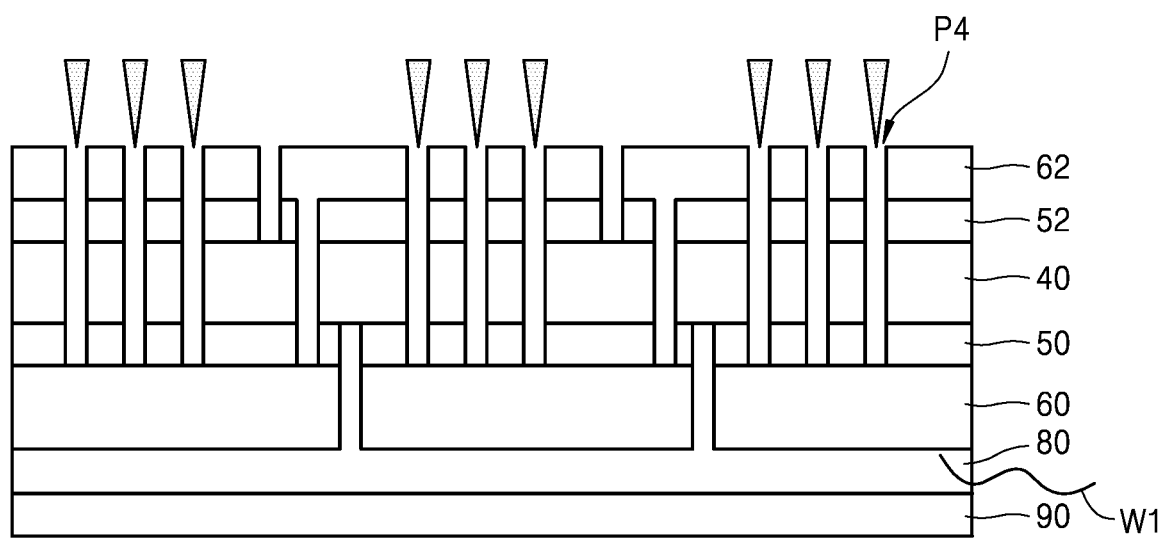
Figure 10:
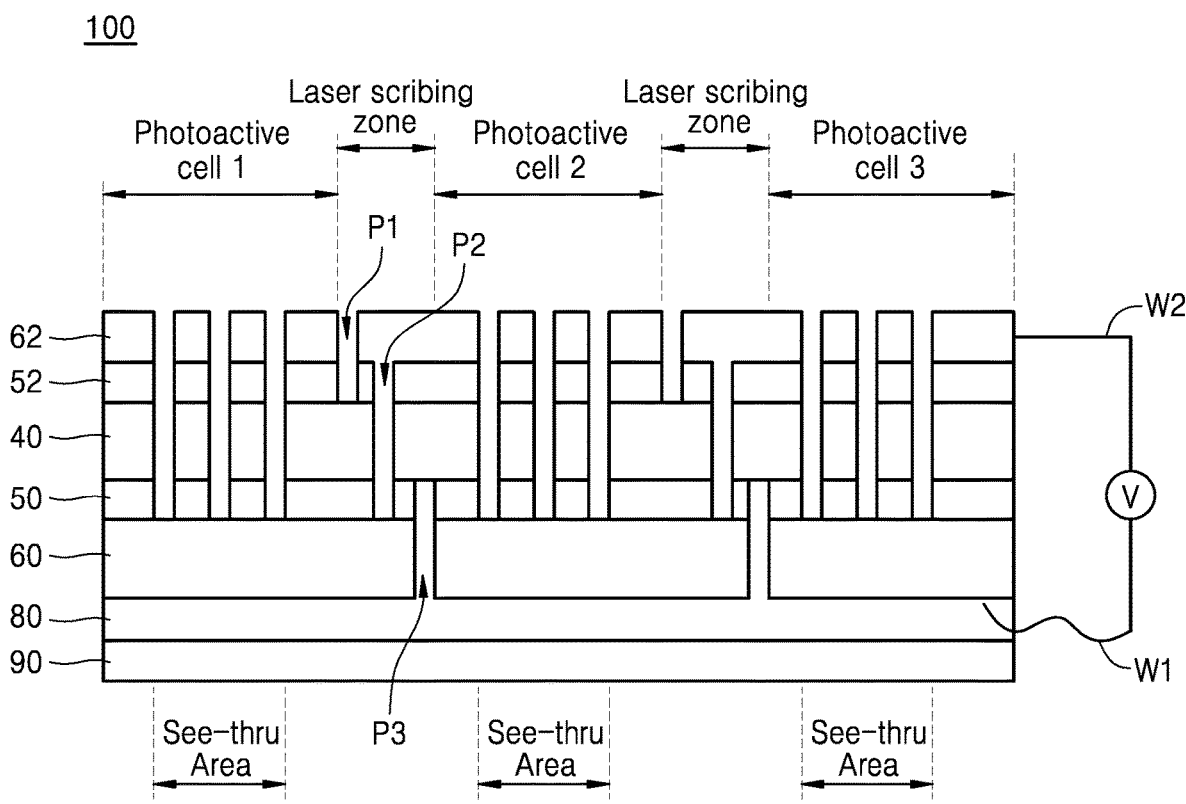

Referring to FIGS. 9 and 10, a P4 laser scribing process is performed to selectively remove at least one portion of each of the first buffer layer 50, the light-absorbing layer 40, the second buffer layer 52, and the second transparent electrode layer 62, thereby forming a P4 see-thru pattern P4.

The P4 see-thru pattern P4 may be formed by a mechanical scribing method according to the shape thereof, but a method of using a laser beam is more easily used in the present invention. The P4 see-thru pattern P4 may be formed in the same manner as in the method of forming the P2 scribing pattern P2.

As an example, when a wide bandgap oxide thin film is used as the first buffer layer 50, the P4 see-thru pattern P4 may be formed by emitting a laser beam in a direction from the second transparent electrode layer 62 to the flexible substrate 90. In this regard, a laser including a light source emitting light having a wavelength range absorbable by the light-absorbing layer 40 may be used. A power of the laser beam used to form the P4 see-thru pattern P4 may be relatively higher than a critical energy of the laser beam used to form the P3 scribing pattern P3.

As another example, when a CdS thin film is used as the first buffer layer 50, it is difficult to completely remove the CdS thin film by emitting a laser beam in a direction from the second transparent electrode layer 62 to the flexible substrate 90. Thus, the P4 see-thru pattern P4 may be formed by emitting a laser beam in a direction from the flexible substrate 90 to the second transparent electrode layer 62. In this case, a laser including a light source capable of emitting light having a wavelength band that transmits the flexible substrate 90, the transparent glue layer 80, and the first transparent electrode layer 60 and is absorbed by the first buffer layer 50.

After forming the P4 see-thru pattern P4, a second wire W2 formed of a metallic material is connected to a portion of the second transparent electrode layer 62 to secure an external contact and then electrically connected to the first wire W1, thereby implementing a flexible thin film solar cell module 100.

Meanwhile, the P4 see-thru pattern P4 is formed between the P1 scribing patterns P1 in the form of holes or lines not to overlap each other. A diameter of the hole or a width of the line may be 200 μm or less (greater than 0). When the diameter of the hole or the width of the line exceeds 200 μm, the hole or line is visually identified, thereby deteriorating external appearance characteristics. Thus, the diameter of the hole or the width of the line should be limited to 200 μm or less (greater than 0). However, in consideration of optical and external appearance characteristics of the thin film solar cell, a P4 see-thru pattern P4 having a size of 100 μm or less (greater than 0) may be preferred.

As shown in FIG. 10, the P4 see-thru pattern P4 is formed between a P1 scribing pattern P1 formed in one cell and a P3 scribing pattern of an adjacent cell. That is, the P4 see-thru pattern P4 is formed in a photoactive cell area other than a laser scribing zone, thereby forming a see-thru area.

Figure 11:
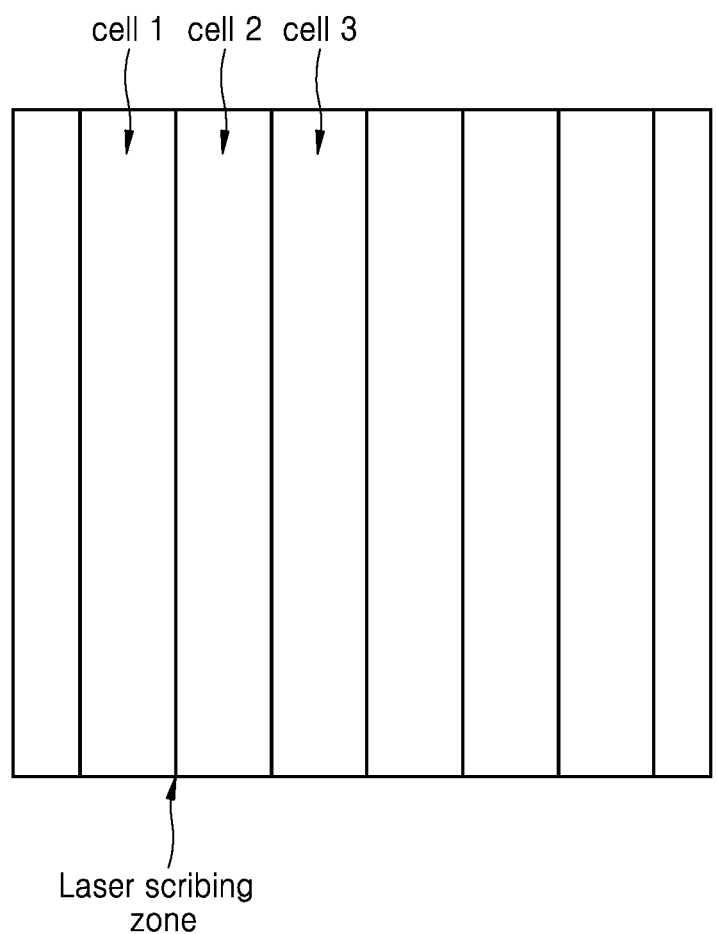
FIGS. 11 to 13 are diagrams schematically illustrating structures of a light-transmitting flexible thin film solar cell module formed by laser patterning according to an embodiment of the present invention.
Figure 12:
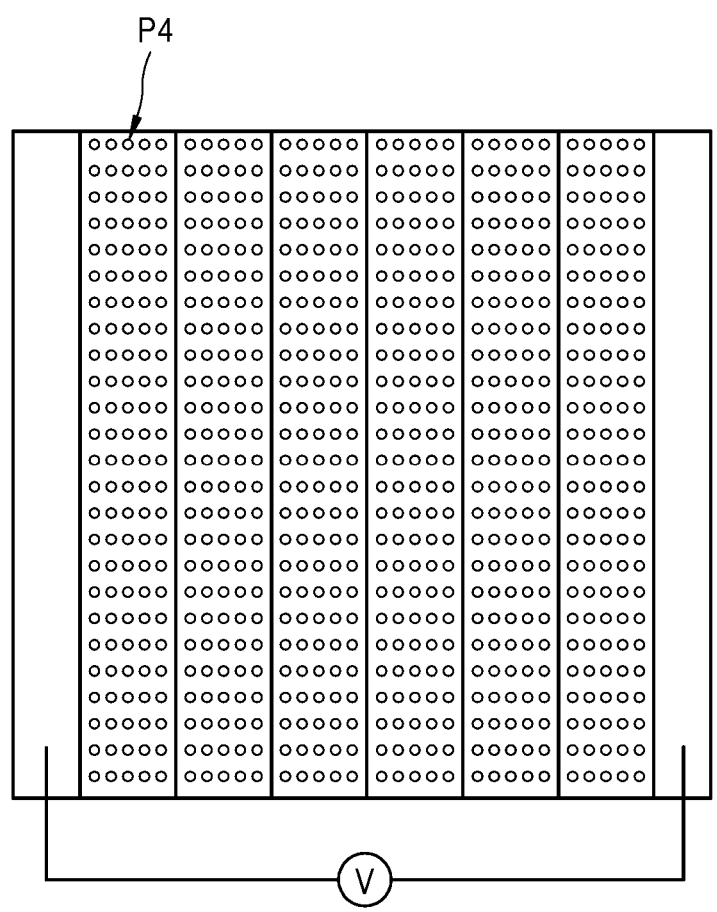
Figure 13:
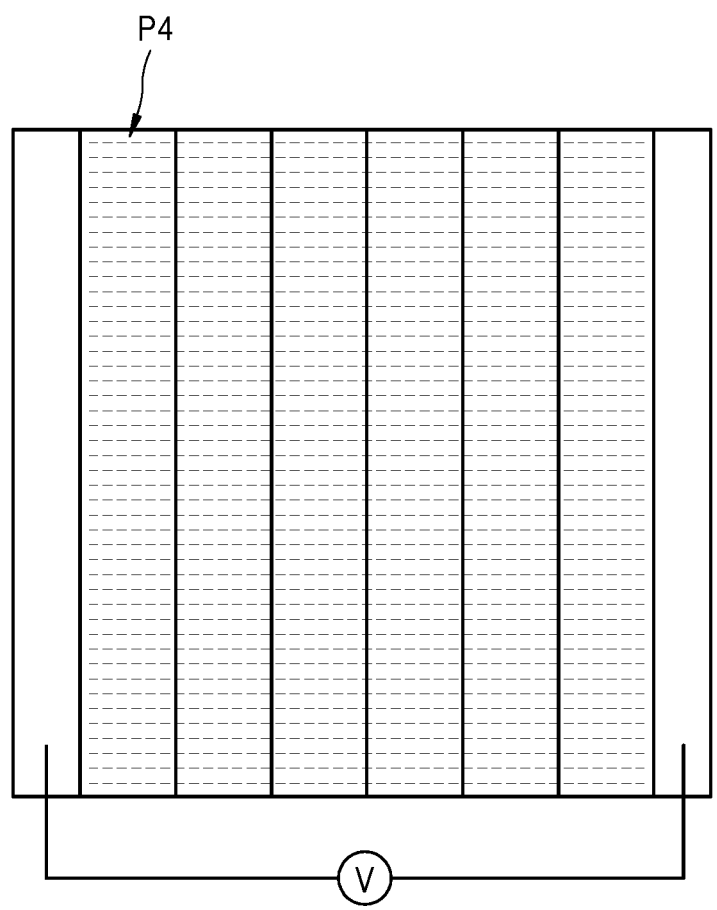

FIGS. 11 to 13 are diagrams schematically illustrating structures of a light-transmitting flexible thin film solar cell module formed by laser patterning according to an embodiment of the present invention.

First, referring to FIG. 11, the P4 see-thru pattern P4 is formed in the cell areas cell 1, cell 2, cell 3, . . . other than the laser scribing zones. As an example, as shown in FIG. 12, the P4 see-thru pattern P4 may be formed in the form of holes. Alternatively, as another example, as illustrated in FIG. 13, the P4 see-thru pattern P4 may be formed in the form of lines aligned in a direction perpendicular to the laser scribing patterns P1, P2, and P3 or in the form of continuous or discontinuous bands with a constant width from one end of the module to the other end. However, the shape of the P4 see-thru pattern P4 is not limited to those described above and the P4 see-thru pattern P4 may also be formed in the form of polygons such as triangles. In this case, the shape of the P4 see-thru pattern P4 may be controlled differently according to intensity and wavelength band of the laser beam.

As an example, in the case of forming the P4 see-thru pattern P4, precise alignment is not required, and the patterning may be performed in the form of dots by scanning the entire area or cell areas cell 1, cell 2, cell 3, . . . of the second transparent electrode layer 62 with laser light sources spaced apart from each other in the form of dots.

As another example, in the case of forming the P4 see-thru pattern, the patterning may be performed in a linear form in the entire area or the cell areas cell 1, cell 2, cell 3, . . . of the second transparent electrode layer 62 by emitting laser beams of laser sources aligned in the form of dots partially overlapping one another. In this case, the shape of the line is not a long continuous line formed over the entire area of the cell, but a discontinuous line formed of short stitch shapes formed only in the photoactive cell area.

As another example, in the case of forming the P4 see-thru pattern P4, precise alignment is not required, and a continuous line aligned to be perpendicular to the laser scribing patterns P1, P2, and P3 may be formed from one end to the other end of the module. In this case, the patterning may be performed by scanning the entire area or the cell areas cell 1, cell 2, cell 3, . . . of the second transparent electrode layer 62. Although the P4 see-thru pattern P4 partially overlaps the areas where the laser scribing patterns P1, P2, and P3 are formed, photoelectric conversion efficiency of the flexible thin film solar cell module 100 is not significantly affected. This is because the flexible thin film solar cell module 100 is not insulated although the P4 see-thru pattern P4 partially overlaps the areas where the laser scribing patterns P1, P2, and P3 are formed.

The light-transmitting flexible thin film solar cell module 100 may be implemented by the above-described method.

Referring back to FIG. 10, the flexible thin film solar cell module 100 according to an embodiment of the present invention has a structure in which the transparent glue layer 80, the first transparent electrode layer 60, the first buffer layer 50, the chalcogenide light-absorbing layer 40, the second buffer layer 52, and the second transparent electrode layer 62 are sequentially stacked on the flexible substrate 90 (hereinafter, referred to as light-transmitting thin film solar cell structure). The light-transmitting thin film solar cell structure further includes the P4 see-thru pattern. In this regard, the P4 see-thru pattern has a structure in which at least one portion of each of the first buffer layer 50, the chalcogenide light-absorbing layer 40, the second buffer layer 52, and the second transparent electrode layer 62 is selectively removed to have a penetrated structure. Hereinafter, descriptions given above with reference to FIGS. 1 to 10 will not be repeated.

The flexible thin film solar cell module 100 is divided into the laser scribing zones and the cell areas cell 1, cell 2, cell 3, . . . . The laser scribing zone is a region formed by the P1 scribing pattern P1, the P2 scribing pattern P2, and the P3 scribing pattern P3 which do not overlap one another. By the P1 scribing pattern P1, the P2 scribing pattern P2, and the P3 scribing pattern P3, a plurality of cells are formed in series.

The cell area is a region defined by a P1 scribing pattern P1 formed in one cell and the P3 scribing pattern formed in an adjacent cell and refers to a photoactive cell area in which photoelectric conversion is possible by incident sunlight. The P4 see-thru pattern P4 is formed not to overlap the P1 scribing pattern P1, the P2 scribing pattern P2, and the P3 scribing pattern P3.

The flexible thin film solar cell module 100 implemented as described above not only avoids deterioration of photovoltage and fill factor, but also induces only a decrease in photocurrent corresponding to the P4 see-thru pattern P4, and thus a decrease in efficiency caused by allowing the solar cell to have light-transmitting properties may be minimized.

Meanwhile, although not shown in the drawings, in the case of manufacturing a flexible thin film solar cell, after forming the release layer 20 on the release substrate 10 and forming a preliminary see-thru pattern on the release layer 20, the light-absorbing layer 40, the first buffer layer 50, and the first transparent electrode layer 60 may be formed on the release layer 20 and the release substrate 10 exposed to the outside by the preliminary see-thru pattern. In this case, portions of the chalcogenide light-absorbing layer 40, the first buffer layer 50, and the first transparent electrode layer 60 may be selectively removed by using a laser scribing method applied to areas around the preliminary see-thru pattern, thereby forming the see-thru pattern. Subsequently, after joining the flexible substrate 90 to the structure on which the see-thru pattern is formed using the transparent glue layer 80, the release substrate 10 and the release layer 20 may be delaminated therefrom. The second buffer layer 52 and the second transparent electrode layer 62 may be sequentially deposited on the bottom surface of the chalcogenide light-absorbing layer 40 exposed after the release layer 20 is delaminated, thereby forming a flexible thin film solar cell. In this case, since the P1 scribing pattern P1, the P2 scribing pattern P2, and the P3 scribing pattern P3 are not formed, cells may be efficiently manufactured by previously forming the preliminary see-thru pattern on the release layer 20 and then removing areas corresponding thereto in order to efficiently form the P4 see-thru pattern P4.

As described above, the chalcogenide-based flexible thin film solar cell module having both high efficiency photovoltaic performance and light transmittance may be implemented by using the method of manufacturing a flexible thin film solar cell module according to the present invention.

A light-transmitting area having a line width of 200 μm or less may be formed by a laser processing method. Since it is difficult to visually identify light-transmitting patterns, external appearances of light-transmitting flexible thin film solar cell module products may be improved.

Also, the high efficiency light-transmitting flexible thin film solar cell module may be applied to various installation environments. For example, by developing a transparent flexible thin film solar cell module in a rollable sheet shape, the module may be selectively attached to or detached from windows of outer walls of buildings and any curved surfaces. In addition, the module may also be attached to curved outer surfaces of vehicles. Although existing solar cell technology has been developed in terms of large-area power generation, the technology for manufacturing a high-functional flexible thin film solar cell module proposed in the present invention suggests a method of utilizing the solar cell as a life-friendly energy source. However, the scope of the present invention is not limited by these effects.

While one or more embodiments of the present invention have been described with reference to the drawings, it will be understood by those of ordinary skill in the art that various changes in form and details may be made therein without departing from the spirit and scope of the present invention as defined by the following claims.

What is claimed is:

1. A flexible thin film solar cell module comprising a see-thru pattern area, the flexible thin film solar cell module comprising:
   a transparent glue layer formed on a flexible substrate;
   a first transparent electrode layer formed on the transparent glue layer;
   a first buffer layer formed on the first transparent electrode layer;
   a light-absorbing layer formed on the first buffer layer;
   a second buffer layer formed on the light-absorbing layer;
   a second transparent electrode layer formed on the second buffer layer; and
   a penetrated P4 see-thru pattern formed by selectively removing at least one portion of the first buffer layer, the light-absorbing layer, the second buffer layer, and the second transparent electrode layer,
   wherein the flexible thin film solar cell module comprises a P3 scribing pattern formed by selectively removing at least one portion of the first transparent electrode layer and the first buffer layer, and
   wherein the flexible thin film solar cell module comprises a P2 scribing pattern formed by selectively removing at least one portion of the first buffer layer, the light-absorbing layer, and the second buffer layer, and wherein the P2 scribing pattern is filled with the second transparent electrode layer.

2. The flexible thin film solar cell module of claim 1, wherein the P4 see-thru pattern comprises a pattern in a form of holes or lines.

3. The flexible thin film solar cell module of claim 2, wherein a diameter of the holes or a width of the lines is greater than 0 and less than or equal to 200 μm.

4. The flexible thin film solar cell module of claim 1, wherein the P4 see-thru pattern is formed in a continuous or partially discontinuous band shape with a certain width from one end to the other end of the module.

5. The flexible thin film solar cell module of claim 1, wherein the first buffer layer comprises at least one of CdS, Zn(O,S), Sn-doped $ZnO_x$, Ti-doped $ZnO_x$, i-$ZnO_x$, and Mg-doped $ZnO_x$, (Mg,Al)-doped $ZnO_x$.

6. The flexible thin film solar cell module of claim 1, wherein the first transparent electrode layer comprises one of In-doped $SnO_x$, Al-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure.

7. The flexible thin film solar cell module of claim 1, wherein the transparent glue layer comprises a thermosetting resin or a photocurable resin.

8. The flexible thin film solar cell module of claim 1, wherein the second buffer layer comprises one of $MoO_x$, $WO_x$, $NiO_x$, $VO_x$, $CuO_x$, and Cu-doped $NiO_x$.

9. The flexible thin film solar cell module of claim 1, wherein the second transparent electrode layer comprises one of In-doped $SnO_x$, Al-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure.

10. The flexible thin film solar cell module of claim 1, wherein the transparent glue layer is in a form buried in a region where the P3 scribing pattern is formed and has a structure in contact with a surface of the light-absorbing layer facing the flexible substrate.

11. The flexible thin film solar cell module of claim 1, wherein the flexible thin film solar cell module comprises a P1 scribing pattern formed by selectively removing at least one portion of the second buffer layer and the second transparent electrode layer, and wherein the P1 scribing pattern is unfilled.

12. The flexible thin film solar cell module of claim 1, wherein the second buffer layer functions to improve ohmic contact between the light-absorbing layer and the second transparent electrode layer and prevent performance deterioration of the light-absorbing layer by damages caused by deposition of the second transparent electrode layer.

13. The flexible thin film solar cell module of claim 1, wherein a surface of the second transparent electrode layer is exposed.

14. The flexible thin film solar cell module of claim 1, wherein a surface of the second buffer layer is exposed.

15. The flexible thin film solar cell module of claim 1, wherein a surface of the light-absorbing layer is exposed.

16. The flexible thin film solar cell module of claim 1, wherein a surface of the first buffer layer is exposed.

17. The flexible thin film solar cell module of claim 1, wherein a surface of the first transparent electrode layer is exposed.

18. The flexible thin film solar cell module of claim 1, further comprising:
   a first wire formed of a metallic material connected to a portion of the first transparent electrode layer; and
   a second wire formed of a metallic material connected to a portion of the second transparent electrode layer,
   wherein the first wire and the second wire are electrically connected.

19. The flexible thin film solar cell module of claim 1, wherein the flexible thin film solar cell module is manufactured by a method comprising:
   forming the light-absorbing layer, the first buffer layer, and the first transparent electrode layer; and
   after forming the light-absorbing layer, the first buffer layer, and the first transparent electrode layer, forming the second transparent electrode layer.

20. A method of manufacturing the flexible thin film solar cell module of claim 1, the method comprising:
   forming a release layer on a release substrate;
   sequentially forming the light-absorbing layer, the first buffer layer, and the first transparent electrode layer on the release layer;
   forming a P3 scribing pattern by removing at least one portion of the first transparent electrode layer and the first buffer layer;
   forming the transparent glue layer on a top surface of the first transparent electrode layer and a region formed by the P3 scribing pattern;

forming the flexible substrate on the transparent glue layer;

joining the first transparent electrode layer to the flexible substrate by curing the transparent glue layer;

removing the release substrate and the release layer from the light-absorbing layer;

forming the second buffer layer on an exposed bottom surface of the light-absorbing layer;

forming the P2 scribing pattern by removing at least one portion of each of the first buffer layer, the light-absorbing layer, and the second buffer layer;

forming the second transparent electrode layer on the second buffer layer and the first transparent electrode layer exposed by the P2 scribing pattern;

forming a P1 scribing pattern by removing at least one portion of the second transparent electrode layer and the second buffer layer; and forming the P4 see-thru pattern by selectively removing at least one portion of the first buffer layer, the light-absorbing layer, the second buffer layer, and the second transparent electrode layer.

21. The method of claim 20, wherein the forming of the P4 see-thru pattern comprises forming the P4 see-thru pattern by emitting a laser beam in a direction from the second transparent electrode layer to the flexible substrate, wherein a laser including a light source emitting light having a wavelength band absorbable by the light-absorbing layer, and wherein an intensity of the laser beam is relatively higher than a critical energy of a laser beam used to form the P3 scribing pattern.

22. The method of claim 20, wherein the forming of the P4 see-thru pattern comprises forming the P4 see-thru pattern by emitting a laser beam in a direction from the flexible substrate to the second transparent electrode layer, wherein a laser including a light source emitting light having a wavelength band transmitting the flexible substrate, the transparent glue layer, and the first transparent electrode layer and absorbable by the first buffer layer, and wherein an intensity of the laser beam is relatively higher than a critical energy of a laser beam used to form the P3 scribing pattern, wherein the first buffer layer comprises at least one of CdS, Zn(O,S), Sn-doped $ZnO_x$, Ti-doped $ZnO_x$, i-$ZnO_x$, and Mg-doped $ZnO_x$, (Mg,Al)-doped $ZnO_x$, wherein the first transparent electrode layer comprises one of In-doped $SnO_x$, Al-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure, wherein the forming of the transparent glue layer comprises forming a transparent glue layer in contact with the top surface of the light-absorbing layer exposed by the P3 scribing pattern, wherein the second buffer layer comprises one of $MoO_x$, $WO_x$, $NiO_x$, $VO_x$, $CuO_x$, and Cu-doped $NiO_x$, and wherein the second transparent electrode layer comprises one of In-doped $SnO_x$, Al-doped $ZnO_x$, In-doped $ZnO_x$, Ga-doped $ZnO_x$, B-doped $ZnO_x$, Ag nanowire, graphene, carbon nanotube, Ag, Mg:Ag alloy, Au, and an electrode material having a metal oxide/thin metal/metal oxide (OMO) structure.

23. The method of claim 20, wherein the forming of the P4 see-thru pattern comprises forming the P4 see-thru pattern by emitting laser beams of laser sources aligned in a form of dots spaced apart from each other or partially overlapping each other.

24. The method of claim 20, wherein the P4 see-thru pattern comprises a pattern in a form of holes or lines, and wherein a diameter of the holes or a width of the lines is greater than 0 and less than or equal to 200 µm, or is formed in a continuous or partially discontinuous band shape with a certain width from one end to the other end of the module.

25. A flexible thin film solar cell module comprising a see-thru pattern area, the flexible thin film solar cell module comprising:

a transparent glue layer formed on a flexible substrate;

a first transparent electrode layer formed on the transparent glue layer;

a first buffer layer formed on the first transparent electrode layer;

a light-absorbing layer formed on the first buffer layer;

a second buffer layer formed on the light-absorbing layer;

a second transparent electrode layer formed on the second buffer layer; and a penetrated P4 see-thru pattern formed by selectively removing at least one portion of the first buffer layer, the light-absorbing layer, the second buffer layer, and the second transparent electrode layer, wherein the P4 see-thru pattern does not penetrate the first transparent electrode.

* * * * *